United States Patent [19]

Werrbach

[11] Patent Number: 4,633,501
[45] Date of Patent: Dec. 30, 1986

[54] PROGRAM DEPENDENT CROSSOVER FILTER (PDC)

[76] Inventor: Donn R. Werrbach, 930 Kaheka St., Honolulu, Hi. 96814

[21] Appl. No.: 723,375

[22] Filed: Apr. 15, 1985

[51] Int. Cl.$^4$ .............................................. H04B 1/66
[52] U.S. Cl. .................................... 381/100; 381/103; 333/28 T
[58] Field of Search .................. 381/99, 98, 100, 103; 333/132, 28 T

[56] References Cited

U.S. PATENT DOCUMENTS

| | | | |
|---|---|---|---|
| 4,118,601 | 10/1978 | Yeap | 381/103 |
| 4,412,100 | 10/1983 | Orban | 381/100 |
| 4,484,345 | 11/1984 | Stearns | 333/132 |
| 4,525,675 | 6/1985 | Richmond | 333/132 |
| 4,583,245 | 4/1986 | Gelow | 381/59 |

Primary Examiner—Gene Z. Rubinson
Assistant Examiner—L. C. Schroeder
Attorney, Agent, or Firm—Irving M. Kriegsman

[57] ABSTRACT

An audio crossover filter which automatically tunes the crossover frequency according to the content of the program audio which is being filtered.

1 Claim, 4 Drawing Figures

BLOCK DIAGRAM – PDC

SUBTRACTIVE VARIABLE STATE CROSSOVER FILTER

PROGRAM DEPENDENT CROSSOVER FILTER (PDC)

BACKGROUND OF THE INVENTION

The present invention relates to a program dependent crossover filter (PDC). The crossover filter receives program audio and splits it into multiple frequency bands for subsequent utilization in a number of objectives (since such subsequent utilization is not functionally a part or means of the PDC system details need not be given of this). As an example, however, subsequent utilization could be a multi-band dynamic range compressor or bi-amplified sound systems.

Conventional crossover filters use fixed (or user adjustable) crossover tuning which does not have or use any means of continuous variable automatic tuning. The PDC is continuously varying, automatic tuning.

SUMMARY OF THE INVENTION

The PDC can consist of any number of "band splits", such as hi-pass/lo-pass, hi-mid-low, or any other number of bands. The present configuration herein disclosed provides 3 output bands (lo-mi-hi). Again, the PDC concept does not necessarily relate to any particular application or actual filter topology.

The end purpose of PDC is to output an energy balance in the various bands which will maintain a consistent energy content ratio between bands regardless of the frequency spectral distribution of the original audio program. This objective must obviously be met with an adaptive band splitting filter.

DETAILED DESCRIPTION OF THE INVENTION

Figure 1:
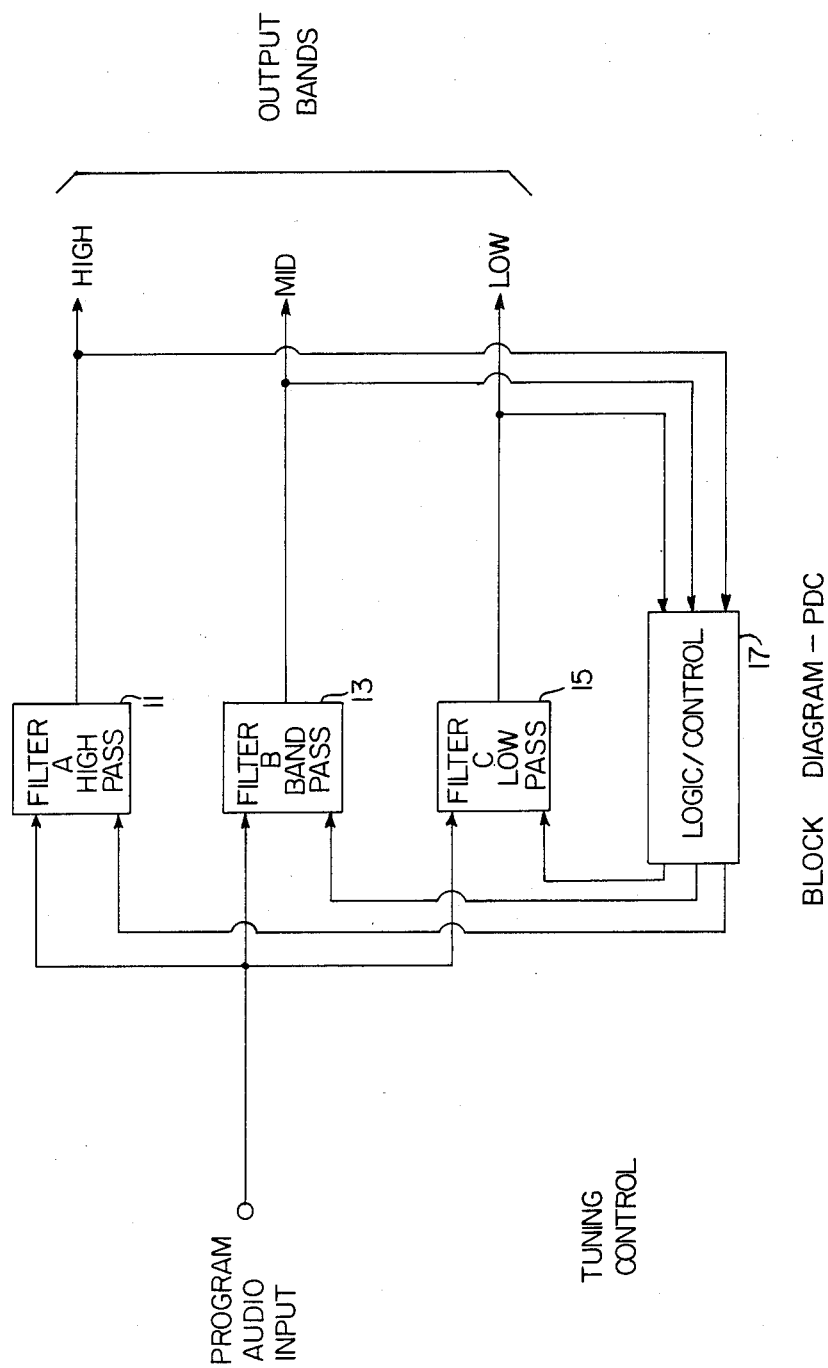
FIG. 1 is a block diagram of an embodiment of the invention.
Figure 2:
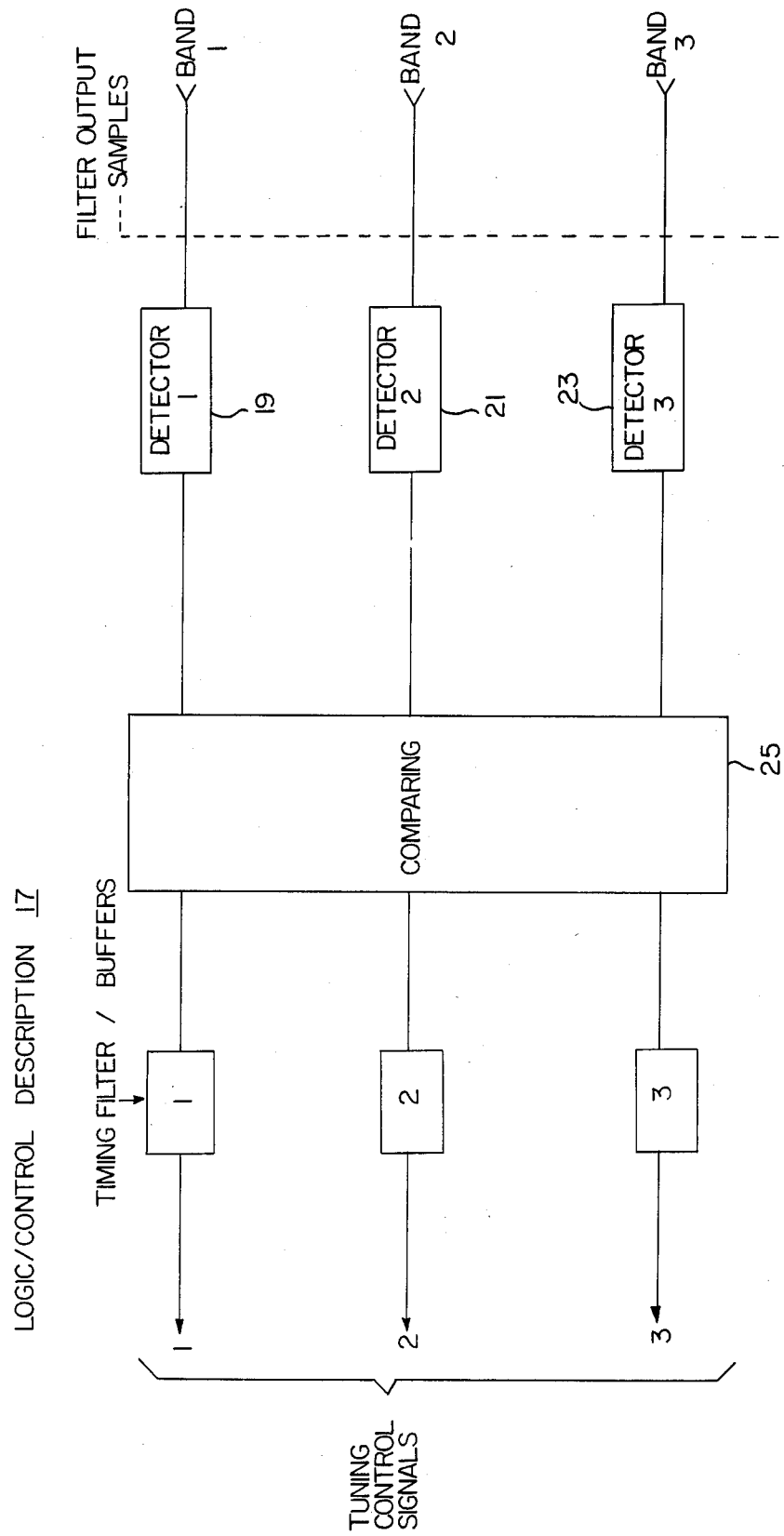
FIG. 2 is a block diagram of the logic/control circuit 17 in FIG. 1.
Figure 3:
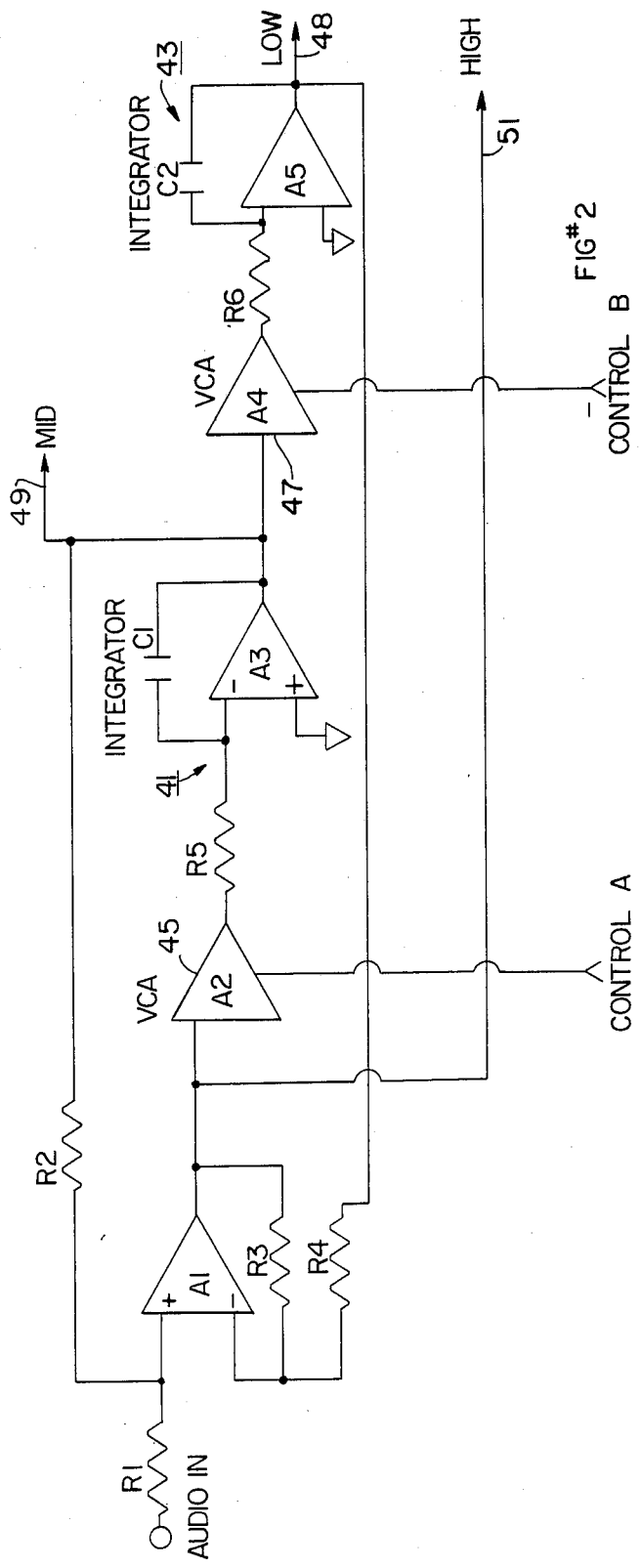
FIG. 3 is a schematic diagram of an embodiment of the invention.
Figure 4:
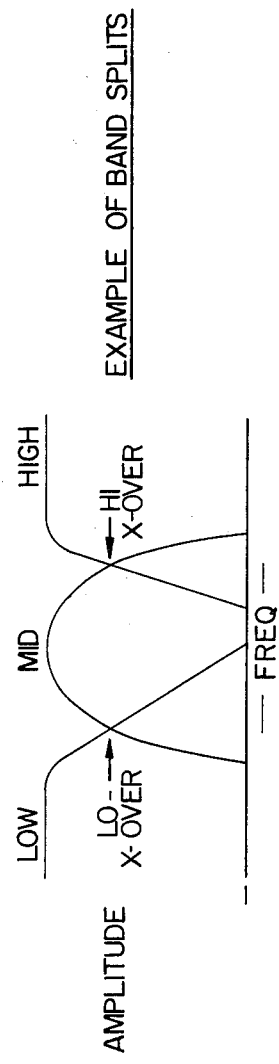
FIG. 4 is a set of curves useful in understanding the invention.

Referring to the block diagram:

Program audio is fed to three filter means: (a) a high-pass filter 11, (b) a band-pass filter 13, (c) a low-pass filter 15. These filters are to produce outputs which will sweep across a certain frequency range according to control signals derived in the logic/control system. Spectral energy content in the output of the bands is analyzed in the logic-control system 17, and appropriate control is administered to the filters.

The hi-pass filter 11 will typically act as a variable cutoff frequency high-pass filter. The band-pass filter 13 will typically act as a variable center frequency-variable bandwidth filter, and the low-pass 15 will act as a variable cutoff frequency low-pass filter.

The present configuration also produces a variable "Q" in the bands such that at all times bands will be equal to the input audio. However, this is not an inherent aspect of the PDC idea. In some applications, it could be feasible that the 3 output bands may not sum to equal the input audio. Some frequency peaking at the crossover frequency may result, without harm to the subsequent utilization of the band signals. The main idea is that the PDC will control the filtered outputs to maintain a desired energy balance in the bands.

Logic/control circuit 17 description:

Audio level is detected from each band by detectors 19, 21 and 23 and the detector outputs are compared one against two, and two against three in a comparator 25. In systems of two bands, only one comparison is needed. In higher numbers of bands, each band is compared with its higher neighbor. Thus, they will tend to distribute their tuning to result in equal band outputs. To facilitate practical circuits and reasonable operation, the tuning signals will have range limits to allow each band filter to sweep only a limited range. In cases where program spectral content is insufficiently wide to produce equal energy distribution in all bands when they are tuned to their limits of range, the filters simply remain tuned to the limit until new program content arrives.

Schematic diagram of an embodiment:

Two control voltages are used to control the 3-band filter. Control "A" sets the mid-to-high band crossover frequency. Control "B" sets the mid-to-low crossover frequency.

The filter consists of two serial integrators 41 and 43 are tuned by voltage variable attenuators 45 and 47 (A2 and A4) arranged in a conventional "state variable" filter topology. These integrators produce two different time constants, however, unlike the conventional state variable filter which uses both integrators tuned identically. The two time constants then produce, by substraction, three output bands 48, 49 and 51 having approximately 6 dB per octave slopes.

Since the filter is subtractive, all output bands will sum "flat" regardless of tuning. Note that the mid-band output is inverted 180 degrees in phase and may need subsequent phase reversal for use.

The PDC may utilize peak, average, RMS, or any other energy detect algorithm in the control/logic detectors, depending on what the application criteria may be (i.e. whether equal RMS energy in bands is desired, or equal peak amplitude, etc.)

The PDC is currently adapted to an audio compression system using 3 bands, but can be used for any number of bands in principle.

What is claimed is:

1. A program dependent crossover filter system comprising:
    a. tunable filter means including a tunable control means for producing more than one frequency band output where band crossover frequencies are tuned by a control signal;
    b. detector means to detect band output levels;
    c. comparator means to compare adjacent band output levels and produce output thereof;
    d. control filter means to convert output of the comparator means to usable tuning control signal(s); and
    e. interface means to couple the tuning control signal(s) of the control filter means to the tunable control means.

* * * * *